(12) United States Patent
Kinugasa

(10) Patent No.: US 10,859,616 B2
(45) Date of Patent: Dec. 8, 2020

(54) SEMICONDUCTOR INTEGRATED CIRCUIT

(71) Applicants: Kabushiki Kaisha Toshiba, Tokyo (JP); Toshiba Electronic Devices & Storage Corporation, Tokyo (JP)

(72) Inventor: Masanori Kinugasa, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 155 days.

(21) Appl. No.: 16/115,859

(22) Filed: Aug. 29, 2018

(65) Prior Publication Data

US 2019/0285674 A1 Sep. 19, 2019

(30) Foreign Application Priority Data

Mar. 13, 2018 (JP) ................................. 2018-045253

(51) Int. Cl.
*G01R 27/08* (2006.01)
*H03K 17/687* (2006.01)

(52) U.S. Cl.
CPC ......... *G01R 27/08* (2013.01); *H03K 17/6872* (2013.01)

(58) Field of Classification Search
CPC .... G01R 27/08; G01R 31/2851; G01R 21/01; G01R 1/18; G01R 29/26; G01R 31/008; G01R 31/28; G01R 31/3277; G01R 31/50; H03K 17/6872; H02M 3/156; G06F 13/4022; G06F 3/0416; H02H 9/046; H02J 7/007; H02J 7/0021; H04B 1/18; H01R 13/6666
See application file for complete search history.

(56) References Cited

U.S. PATENT DOCUMENTS

| | | | | | |
|---|---|---|---|---|---|
| 6,563,293 | B2 * | 5/2003 | Marino | ............... | H02M 3/1584 323/272 |
| 7,652,520 | B2 * | 1/2010 | Gatta | ................... | H01L 27/0705 327/436 |
| 8,241,926 | B2 | 8/2012 | Yoshikawa | | |
| 8,692,609 | B2 * | 4/2014 | Olson | .................... | G01R 19/04 327/108 |
| 9,985,526 | B1 * | 5/2018 | Oak | ...................... | H02M 1/088 |

FOREIGN PATENT DOCUMENTS

| | | |
|---|---|---|
| JP | 2009-216565 A | 9/2009 |
| JP | 2010-199384 A | 9/2010 |
| JP | 2010-276360 A | 12/2010 |

* cited by examiner

*Primary Examiner* — Vinh P Nguyen
(74) *Attorney, Agent, or Firm* — White & Case LLP

(57) ABSTRACT

According to one embodiment, a semiconductor integrated circuit includes a signal supply controller to supply a signal, which allows a level of a resistance value of one of the first and second switching elements to be a predetermined level, to the elements via shared signal wire, and to set a current flowing through the higher-potential side terminal in the one of the first and second switching elements to a value which causes the level of the resistance value to be the predetermined level. In a state where the level of the resistance value of the one of the first and second switching elements is set to the predetermined level, another of the first and second switching elements is brought into a conducting state.

10 Claims, 2 Drawing Sheets

| Inputs | | | Function |
|---|---|---|---|
| TEST | $\overline{OE}$ | S | |
| L | L | L | A port = B1 port |
| L | L | H | A port = B1 port = B2 port |
| L | H | X | Disconnect |

X: Don't care

SEMICONDUCTOR INTEGRATED CIRCUIT

CROSS-REFERENCE TO RELATED APPLICATIONS

This application is based upon and claims the benefit of priority from Japanese Patent Application No. 2018-045253, filed Mar. 13, 2018, the entire contents of which are incorporated herein by reference.

FIELD

Embodiments described herein relate generally to a semiconductor integrated circuit.

BACKGROUND

In switch products such as SPDT (Single Pole Dual Throw) and SP4T (Single Pole 4 Throw), a plurality of semiconductor switching elements (hereinafter, also referred to as "switching elements") are coupled in parallel between both ports. Such switch products have a multiplex function. For those switch products, a Kelvin measurement method has been known as a method for precisely measuring an ON-resistance (resistance value during a conduction time) of any semiconductor switching element coupled between both ports.

According to the Kelvin measurement method, an ON-resistance of a switching element as a measurement object can be measured by applying a current to a force terminal as one of two electrodes provided on one side of the switching elements within a semiconductor integrated circuit, applying no current to a Kelvin terminal as the other electrode, and measuring a voltage of this Kelvin terminal.

DETAILED DESCRIPTION

In general, according to one embodiment, there is provided a semiconductor integrated circuit, comprising: a plurality of pairs of switching elements including a first switching element and a second switching element, the first switching element being coupled between a higher-potential side terminal and a first lower-potential side terminal, the second terminal being coupled between the higher-potential side terminal and a second lower-potential side terminal different from the first lower-potential side terminal; and a signal supply controller configured to perform control to supply a signal, which allows a level of a resistance value of one of the first and second switching elements to be a predetermined level, to the first and second switching elements via signal wire shared by the pairs of switching elements, and to set a current flowing through the higher-potential side terminal in the one of the first and second switching elements to a value which causes the level of the resistance value to be the predetermined level, the signal supply controller being configured, in a state where the level of the resistance value of the one of the first and second switching elements is set to the predetermined level, to bring another of the first and second switching elements into a conducting state.

Hereinafter, embodiments will be described with reference to the drawings.

Figure 1:
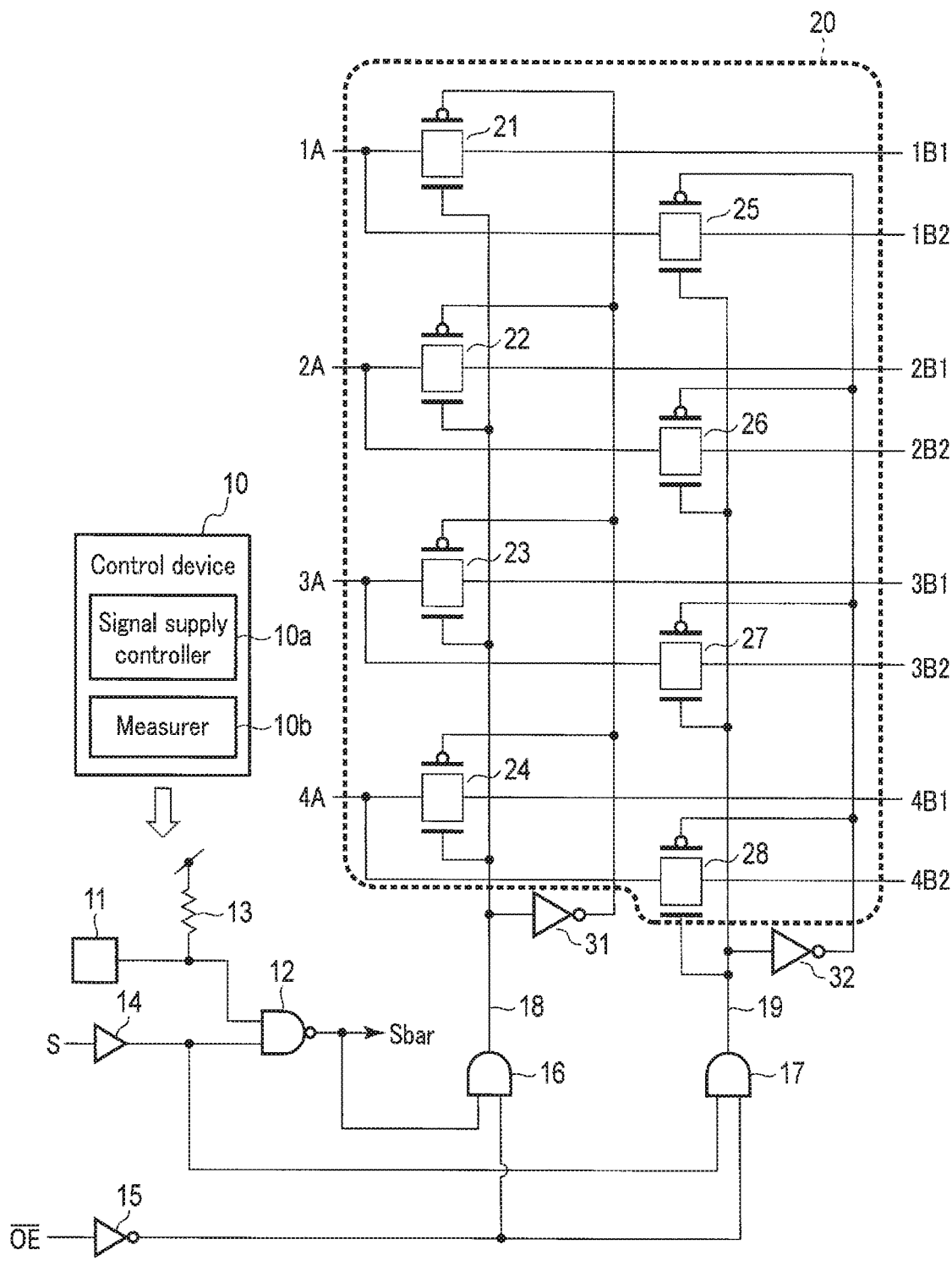
FIG. 1 is a diagram showing a configuration example of a semiconductor integrated circuit according to an embodiment.

FIG. 1 is a diagram showing a configuration example of a semiconductor integrated circuit according to the present embodiment.

In the example shown in FIG. 1, the semiconductor integrated circuit according to the present embodiment includes a control device 10 and a semiconductor switching circuit 20. The control device 10 controls signals to be supplied to the semiconductor switching circuit 20. The control device 10 can be realized by a computer device including a CPU (Central processing unit), a memory device, etc. Types of a CPU are not limited as long as it is a processor. The control device 10 may be provided outside the semiconductor integrated circuit.

The control device 10 includes a signal supply controller 10a and a measurer 10b. The signal supply controller 10a controls output signals for use in resistance measurement of semiconductor switching elements within the semiconductor switching circuit 20. The measurer 10b measures resistance values of semiconductor switching elements within the semiconductor switching circuit 20. Each of the units within the control device 10 may be realized mainly by a CPU's execution software (firmware) or by hardware. For example, a CPU controls processing performed by each of the units within the control device 10.

The signal supply controller 10a of the control device 10 outputs a control signal to control supply of a test signal for use in resistance measurement of any semiconductor switching element within the semiconductor switching circuit 20. Upon receipt of this control signal, a test signal is input to a test terminal 11 that is coupled to a first input terminal of a NAND circuit 12. To this input terminal, a higher-potential side protective resistance 13 is coupled.

The signal supply controller 10a of the control device 10 outputs signal S and signal $OE_{bar}$. The signal S is input to a buffer 14. An output terminal of the buffer 14 is coupled to a second input terminal of the NAND circuit 12. Signal Sbar to be output from the NAND circuit 12 is input to a first input terminal of an AND circuit 16. The output terminal of the buffer 14 is coupled to a first input terminal of an AND circuit 17, too.

The signal $OE_{bar}$ is input to an inverter circuit 15. An output terminal of the inverter 15 is coupled to a second input terminal of the AND circuit 16 and to a second input terminal of the AND circuit 17.

The semiconductor switching circuit 20 includes semiconductor switching elements (hereinafter, also referred to as "switching elements") 21, 22, 23, 24, 25, 26, 27, and 28. The semiconductor switching circuit 20 includes higher-potential side terminals (ports) 1A, 2A, 3A, and 4A, and lower-potential side terminals 1B1, 1B2, 2B1, 2B2, 3B1, 3B2, 4B1, and 4B2.

Each of the switching elements 21, 22, 23, 24, 25, 26, 27, and 28 includes a P-type channel MOSFET (field-effect transistor) (hereinafter, also referred to as "P-type MOSFET"), and an N-type channel MOSFET (hereinafter, also referred to as "N-type MOSFET").

The switching elements 21 and 25 form the first pair of switching elements coupled in parallel within the semiconductor switching circuit 20. The switching elements 21 and 25 are coupled in parallel to signal wire coupled to the terminal 1A. The switching element 21 is coupled between the terminal 1A and the terminal 1B1. The switching element 25 is coupled between the terminal 1A and the terminal 1B2.

The switching elements 22 and 26 form the second pair of switching elements coupled in parallel within the semiconductor switching circuit 20. The switching elements 22 and 26 are coupled in parallel to signal wire coupled to the terminal 2A. The switching element 22 is coupled between the terminal 2A and the terminal 2B1. The switching element 26 is coupled between the terminal 2A and the terminal 2B2.

The switching elements 23 and 27 form the third pair of switching elements coupled in parallel within the semiconductor switching circuit 20. The switching elements 23 and 27 are coupled in parallel to signal wire coupled to the terminal 3A. The switching element 23 is coupled between the terminal 3A and the terminal 3B1. The switching element 27 is coupled between the terminal 3A and the terminal 3B2.

The switching elements 24 and 28 form the fourth pair of switching elements coupled in parallel within the semiconductor switching circuit 20. The switching elements 24 and 28 are coupled in parallel to signal wire coupled to the terminal 4A. The switching element 24 is coupled between the terminal 4A and the terminal 4B1. The switching element 28 is coupled between the terminal 4A and the terminal 4B2.

An output terminal of the AND circuit 16 is coupled to gate terminals of P-type MOSFETs of the switching elements 21, 22, 23, and 24 via signal wire 18 shared by the switching elements 21, 22, 23, and 24, and an inverter circuit 31. The output terminal of the AND circuit 16 is coupled to gate terminals of N-type MOSFETs of the switching elements 21, 22, 23, and 24 via the signal wire 18.

An output terminal of the AND circuit 17 is further coupled to gate terminals of P-type MOSFETs of the switching elements 25, 26, 27, and 28 via signal wire 19 shared by the switching elements 25, 26, 27, and 28, and an inverter circuit 32. The output terminal of the AND circuit 17 is coupled to gate terminals of N-type MOSFETs of the switching elements 25, 26, 27, and 28 via the signal wire 19.

Described next is a level of a resistance value which depends on a coupling state of each electrode and a signal. In the description below, the switching element 21 will be described as an example. The following description applies to the other switching elements 22, 23, 24, 25, 26, 27, and 28, too.

The P-type MOSFET and the N-type MOSFET of the switching element 21 are coupled in parallel to the signal wire coupled to the terminal 1A. The terminal 1A is coupled to a source terminal of the P-type MOSFET and a drain terminal of the N-type MOSFET. The terminal 1B1 is coupled to a drain terminal of the P-type MOSFET and a source terminal of the N-type MOSFET.

When an L-level (GND level) signal is input to the gate terminal of the P-type MOSFET, and an H-level (power-supply voltage (VCC) level) signal is input to the terminal 1A, this P-type MOSFET has a resistance value of an ON (conductive) level.

When an H-level signal is input to the gate terminal of the N-type MOSFET, and an L-level signal is input to the terminal 1A, this N-type MOSFET has a resistance value of an ON level.

When a signal of an intermediate level between the H level and the L level is input to each of the gate terminal of the P-type MOSFET and the gate terminal of the N-type MOSFET, each of the P-type MOSFET and N-type MOSFET has a resistance value of a level which depends on an input signal level.

Figures 2, 3:
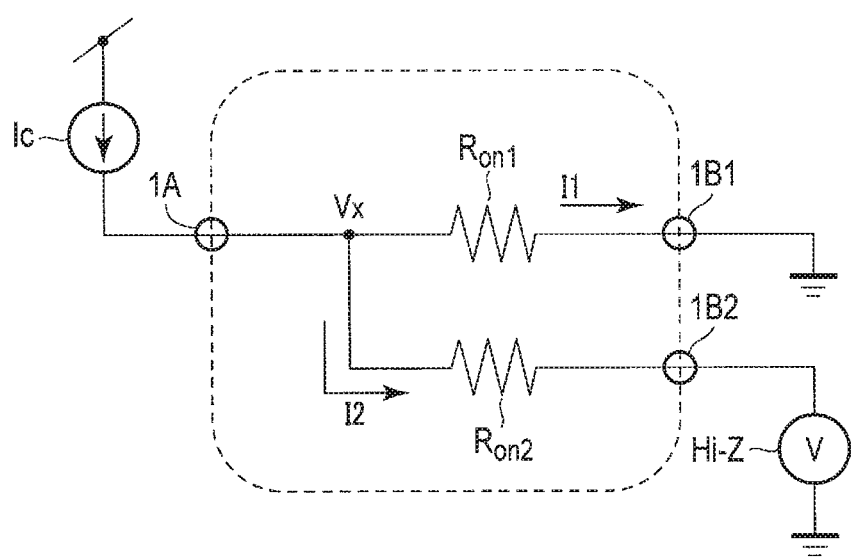
FIG. 2 is a diagram illustrating a true-value table regarding the content of operations in the semiconductor integrated circuit according to the embodiment.
FIG. 3 is a diagram illustrating the principle of Kelvin measurement that is applied to the semiconductor integrated circuit according to the embodiment.

FIG. 2 is a diagram illustrating a true-value table regarding the content of operations in the semiconductor integrated circuit according to the present embodiment.

As illustrated in FIG. 2, when the signal supply controller 10a of the control device 10 sets a test signal to be output from the test terminal 11, to an L level, sets the signal $OE_{bar}$ to an L level, and sets the signal S to an H level, signals to be output from the AND circuit 16 and the AND circuit 17 become H-level signals. As a result, an L-level signal is input to the gate terminal of a P-type MOSFET of each switching element, while an H-level signal is input to the gate terminal of an N-type MOSFET of each switching element.

Under this condition, when an H-level signal is input to the source terminal of the P-type MOSFET of each switching element, the P-type MOSFET of each switching element is conducted. That is, all the P-type MOSFETs of all the switching elements are conducted. When an L-level signal is input to the drain terminal of the N-type MOSFET of each switching element, the N-type MOSFET of each switching element is conducted. That is, all the N-type MOSFETs of all the switching elements are conducted.

As shown in FIG. 2, when the signal supply controller 10a of the control device 10 sets a test signal to be supplied from the test terminal 11, to an L level, and sets each of the signal $OE_{bar}$ and the signal S to an L level, an output signal from the AND circuit 16 becomes an H-level signal. Then, an L-level signal is input to the gate terminal of the P-type MOSFET of each of the switching elements 21, 22, 23, and 24, while an H-level signal is input to the gate terminal of the N-type MOSFET of each of the switching elements 21, 22, 23, and 24.

On the other hand, an output signal from the AND circuit 17 becomes an L-level signal, and an H-level signal is input to the gate terminal of the P-type MOSFET of each of the switching elements 25, 26, 27, and 28, while an L-level signal is input to the gate terminal of the N-type MOSFET of each of the switching elements 25, 26, 27, and 28.

Under this condition, as described above, all the P-type MOSFETs or all the N-type MOSFETs can be brought into a conducting state with respect to the switching elements 21, 22, 23, and 24. On the other hand, with respect to the switching elements 25, 26, 27, and 28, not all the respective P-type MOSFETs and the respective N-type MOSFETs can be brought into a conducting state.

When the signal supply controller 10a of the control device 10 sets a test signal to be supplied from the test terminal 11, to an L level, and sets the signal $OE_{bar}$ to an H level, signals to be output from the AND circuit 16 and the AND circuit 17 become L-level signals regardless of level of the signal S. Under this condition, none of the P-type MOSFETs and the N-type MOSFETs of all the switching elements are conducted.

Described below is the case of measuring an ON-resistance of the P-type MOSFET of each switching element.

As described above, in the pairs of switching elements, for example, in the pair of switching elements 21 and 25, to measure an ON-resistance of the P-type MOSFET of the switching element 21 coupled between the terminal 1A and the terminal 1B1, the signal supply controller 10a of the control device 10 sets a current flowing through this switching element 21 to an H level, so that the P-type MOSFET of each switching element is conducted.

The measurer 10b monitors a voltage measured by a voltmeter grounded and coupled to the terminal 1B2, thereby being able to precisely measure an ON-resistance of the P-type MOSFET of the switching element 21 based on a value of a current having flowed through the switching element 21 and a measured value of a voltage.

Similarly, to measure an ON-resistance of the P-type MOSFET of the switching element 25 coupled between the terminal 1A and the terminal 1B2, the signal supply controller 10a of the control device 10 sets a current flowing though this switching element 25 to an H level.

The measurer 10b monitors a voltage measured by a voltmeter grounded and coupled to the terminal 1B1, thereby being able to precisely measure an ON-resistance of the P-type MOSFET of the switching element 25 based on a value of a current having flowed through the switching element 25 and a measured value of a voltage.

Described next is the case of measuring an ON-resistance of the N-type MOSFET of each switching element.

As described above, in the pairs of switching elements, for example, in the pair of switching elements 21 and 25, to measure an ON-resistance of the N-type MOSFET of the switching element 21 coupled between the terminal 1A and the terminal 1B1, the signal supply controller 10a of the control device 10 sets a current flowing through this switching element 21 to an L level, so that the N-type MOSFET in each switching element is conducted.

The measurer 10b monitors a voltage measured by a voltmeter grounded and coupled to the terminal 1B2, thereby being able to precisely measure an ON-resistance of the N-type MOSFET of the switching element 21 based on a value of a current having flowed through the switching element 21 and a measured value of a voltage.

Similarly, to measure an ON-resistance of the N-type MOSFET of the switching element 25 coupled between the terminal 1A and the terminal 1B2, the signal supply controller 10a of the control device 10 sets to an L level a current flowing though this switching element 25.

The measurer 10b monitors a voltage measured by a voltmeter grounded and coupled to the terminal 1B1, thereby being able to precisely measure an ON-resistance of the N-type MOSFET of the switching element 25 based on a value of a current having flowed through the switching element 25 and a measured value of a voltage.

FIG. 3 is a diagram illustrating the principle of Kelvin measurement that is applied to the semiconductor integrated circuit according to the present embodiment.

FIG. 3 shows an equivalent circuit of the semiconductor switching elements within the semiconductor switching circuit 20, in which the terminal 1A is set to a terminal on a higher-potential side (power-supply side), the terminal 1B1 is set to a first terminal of a lower-potential side (ground side), and the terminal 1B2 is set to a second terminal of the lower-potential side.

Regarding an resistance $R_{on1}$ between the terminal LA and the terminal 1B1, and an resistance $R_{on2}$ between the terminal 1A and the terminal 1B2 in this circuit, in the case of the resistance $R_{on1}$ being a measurement object, the terminal 1B2 is grounded and provided with a voltmeter, while the terminal 1B1 is merely grounded.

Since an impedance of the voltmeter is high, current I2 flowing through the resistance $R_{on2}$ is taken as zero. Accordingly, since current I1 flowing through the resistance $R_{on1}$ is equal to current Ic of a power supply on the side of the terminal 1A, a value of potential Vx in a branch point between the resistance $R_{on1}$ and the resistance $R_{on2}$ on the side of the terminal 1A is equal to a value of voltage $V_{Measure}$ between the resistance $R_{on1}$ and the terminal 1B1 (voltage drop in each end of the resistance $R_{on1}$).

Herein, a value of the resistance $R_{on1}$ can be determined by the following expression (1). Accordingly, a resistance value can precisely be measured.

$$R_{on1} = V_{Measure}/Ic \qquad (1)$$

In the case of the resistance $R_{on2}$ being a measurement object, the terminal 1B1 is grounded and provided with a voltmeter, while the terminal 1B2 is merely grounded. With this configuration, since current I2 flowing through the resistance $R_{on2}$ is equal to current Ic of the power supply, a value of the potential Vx in the branch point between the resistance $R_{on1}$ and the resistance $R_{on2}$ is equal to a value of the voltage $V_{Measure}$ between the resistance $R_{on2}$ and the terminal 1B2 (voltage drop in each end of the resistance $R_{on2}$).

Herein, a value of the resistance $R_{on2}$ can be determined by the following expression (2).

$$R_{on1} = V_{Measure}/Ic \qquad (2)$$

Described next is the case of measuring a parallel combined resistance value of the P-type MOSFET and the N-type MOSFET of each switching element.

In the pairs of switching elements shown in FIG. 1, for example, in the pair of switching elements 21 and 25, to measure a parallel combined resistance value of the P-type MOSFET and the N-type MOSFET of the switching element 21 coupled between the terminal 1A and the terminal 1B1, the signal supply controller 10a of the control device 10 sets a current flowing through this switching element 21 to an intermediate level between an H level and an L level, so that a level of a resistance value of each of the P-type MOSFET and the N-type MOSFET of each switching element becomes a predetermined level.

The measurer 10b monitors a voltage measured by a voltmeter grounded and coupled to the terminal 1B2, thereby being able to precisely measure a parallel combined resistance value of the P-type MOSFET and the N-type MOSFET of the switching element 21, based on a value of a current having flowed through the switching element 21 and a measured value of a voltage.

Similarly, to measure a parallel combined resistance value of the P-type MOSFET and the N-type MOSFET of the switching element 25 coupled between the terminal 1A and the terminal 1B2, the signal supply controller 10a of the control device 10 sets a current flowing though this switching element 25 to an intermediate level between an H level and an L level.

The measurer 10b monitors a voltage measured by a voltmeter grounded and coupled to the terminal 1B1, thereby being able to precisely measure a parallel combined resistance value of the P-type MOSFET and the N-type MOSFET of the switching element 25, based on a value of a current having flowed through the switching element 25 and a measured value of a voltage.

Subsequently, the control device 10 makes a similar measurement of an ON-resistance or a parallel combined resistance value with respect to the pair of the switching elements 22 and 26 coupled to the terminal 2A, the pair of the switching elements 23 and 27 coupled to the terminal 3A, and the pair of the switching elements 24 and 28 coupled to the terminal 4A. In this manner, the control device 10 is able to precisely measure an ON-resistance or a parallel combined resistance value of all the switching elements in all the pairs.

According to the embodiment, the semiconductor switching circuit 20 is provided with a single test terminal 11 that supplies a test signal for use in resistance measurement of the semiconductor switching elements within the semiconductor switching circuit 20, and is also provided with the plurality of pairs of the switching elements coupled in parallel to a single terminal on a higher-potential side of the semiconductor switching circuit 20. According to the embodiment, in the above case, when resistance measurement is performed with respect to each of the switching elements in the pairs, all the switching elements coupled between both ports of the semiconductor switching circuit 20 can be set to an ON state by supplying a potential to the test terminal 11.

Accordingly, the terminals other than the one subject to measurement can be deemed as Kelvin terminals, thereby eliminating the necessity of providing an existing Kelvin terminal to each pair of the switching elements coupled in parallel to a single terminal on a higher-potential side. This reduces an area occupied by a terminal for use in resistance measurement of each element within the semiconductor switching circuit 20.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made. The accompanying claims and their equivalents are intended to cover such forms or modifications as would fall within the scope of the inventions.

The invention claimed is:

1. A semiconductor integrated circuit, comprising:
a plurality of pairs of switching elements including a first switching element and a second switching element, the first switching element being coupled between a higher-potential side terminal and a first lower-potential side terminal, the second switching element being coupled between the higher-potential side terminal and a second lower-potential side terminal different from the first lower-potential side terminal; and
a signal supply controller configured to perform control to supply a signal, which allows a level of a resistance value of one of the first and second switching elements to be a predetermined level, to the first and second switching elements via first signal wire shared by the first switching elements and via second signal wire shared by the second switching elements, and to set a current flowing through the higher-potential side terminal in the one of the first and second switching elements to a value which causes the level of the resistance value to be the predetermined level,
the signal supply controller being configured, in a state where the level of the resistance value of the one of the first and second switching elements is set to the predetermined level, to bring another of the first and second switching elements into a conducting state,
the first and second switching elements being connected to the first and second signal wires, respectively,
the first and second signal wires being connected to a control logic terminals,
the signal supply controller being configured to output, when resistance measurement is performed with respect to one of the first and second switching elements, a control signal to the control logic terminals connected to the first and second signal wires, and each pair of the switching elements including the first and second switching elements being connected to different higher-potential side terminal.

2. The semiconductor integrated circuit according to claim 1, wherein the another of the first and second switching elements is brought into the conducting state and is electrically connected with a device having high impedance.

3. The semiconductor integrated circuit according to claim 2, further comprising a measurer configured to measure a voltage with a voltmeter coupled to the another of the first and second switching elements, and to measure the resistance value of the one of the first and second switching elements, based on the measured voltage and the set value of the current.

4. The semiconductor integrated circuit according to claim 3, further comprising a test terminal, wherein a control signal is input through the test terminal by the signal supply controller to control the pairs of switching elements.

5. The semiconductor integrated circuit according to claim 1, wherein:
the first switching element includes a P-type channel field-effect transistor and an N-type channel field-effect transistor coupled in parallel, which are provided between the higher-potential side terminal and the first lower-potential side terminal, and
the second switching element includes a P-type channel field-effect transistor and an N-type channel field-effect transistor coupled in parallel, which are provided between the higher-potential side terminal and the second lower-potential side terminal different from the first lower-potential side terminal.

6. A semiconductor integrated circuit, comprising:
a plurality of pairs of switching elements including a first switching element and a second switching element, the first switching element being coupled between a higher-potential side terminal and a first lower-potential side terminal, the second switching element being coupled between the higher-potential side terminal and a second lower-potential side terminal different from the first lower-potential side terminal;
a signal supply controller configured to perform control to supply a signal, which allows a level of a resistance value of one of the first and second switching elements to be a predetermined level, to the first and second switching elements via first signal wire shared by the first switching elements and via second signal wire shared by the second switching elements when measuring the resistance value of the one of the first and second switching elements, and to set a current flowing through the higher-potential side terminal in the one of the first and second switching elements as a measurement object of the resistance value to a value which causes the level of the resistance value to be the predetermined level; and
a measurer configured to measure a voltage with a voltmeter coupled to another of the first and second switching elements, in a state where the level of the resistance value of the one of the first and second switching elements is set to the predetermined level, and to measure a resistance value of the one of the first and second switching elements, based on the measured voltage and the set value of the current,
the first and second switching elements being connected to the first and second signal wires, respectively,
the first and second signal wires being connected to a control logic terminals, the signal supply controller being configured to output, when resistance measurement is performed with respect to one of the first and second switching elements, a control signal to the control logic terminals connected to the first and second signal wires, and each pair of the switching elements including the first and second switching elements being connected to different higher-potential side terminal.

7. The semiconductor integrated circuit according to claim 6, wherein:

each of the first and second switching elements comprises:
- a P-type channel field-effect transistor including a gate terminal, a source terminal, and a drain terminal, the source terminal being coupled to the higher-potential side terminal, the drain terminal in the first switching elements being coupled to the first lower-potential side terminal, the drain terminal in the second switching elements being coupled to the second lower-potential side terminal different from the first lower-potential side terminal; and
- an N-type channel field-effect transistor including a gate terminal, a source terminal, and a drain terminal, the drain terminal being coupled to the higher-potential side terminal, the source terminal in the first switching elements being coupled to the first lower-potential side terminal, the source t terminal in the second switching elements being coupled to the second lower-potential side terminal different from the first lower-potential side terminal;

the signal supply controller is configured to perform control:
when measuring a resistance value of the P-type channel field-effect transistor of the one of the first and second switching elements, to supply a signal, which allows a level of a resistance value of the P-type channel field-effect transistor of the first switching element to be a predetermined level, to the gate terminal of the P-type channel field-effect transistor of the first switching element via the first signal wire, and to supply a signal, which allows a level of a resistance value of the P-type channel field-effect transistor of the second switching element to be a predetermined level, to the gate terminal of the P-type channel field-effect transistor of the second switching element via the second signal wire; and
to set a current flowing through the higher-potential side terminal in the one of the first and second switching elements as the measurement object to a value which causes the level of the resistance value to be a predetermined level; and the measurer is configured:
to measure a voltage with a voltmeter coupled to another of the first and second switching elements, in a state where a level of a resistance value of the P-type channel field-effect transistor of the one of the first and second switching elements is set to the predetermined level; and
to measure a resistance value of the P-type channel field-effect transistor of the one of the first and second switching elements, based on the measured voltage and the set value of current.

8. The semiconductor integrated circuit according to claim 7, wherein:

the signal supply controller is configured to perform control:
when measuring a combined resistance value of a resistance value of the P-type channel field-effect transistor of the one of the first and second switching elements and a resistance value of the N-type channel field-effect transistor of the one of the first and second switching elements, to supply a signal, which allows a level of a resistance value of each of the P-type channel field-effect transistor and the N-type channel field-effect transistor of the first and second switching elements to be a predetermined level, to the gate terminal of the P-type channel field-effect transistor and the gate terminal of the N-type channel field-effect transistor of the first and second switching elements via the first signal wire and via the second signal wire; and
to set a current flowing through the higher-potential side terminal in the one of the first and second switching elements as the measurement object to a value which causes the level of the resistance value to be a predetermined level; and the measurer is configured:
to measure a voltage with a voltmeter coupled to another of the first and second switching elements, in a state where a level of a resistance value of each of the P-type channel field-effect transistor and the N-type channel field-effect transistor of the one of the first and second switching elements is set to the predetermined level; and
to measure the combined resistance value of the one of the first and second switching elements, based on the measured voltage and the set value of current.

9. The semiconductor integrated circuit according to claim 6, wherein:

each of the first and second switching elements comprises:
- a P-type channel field-effect transistor including a gate terminal, a source terminal, and a drain terminal, the source terminal being coupled to the higher-potential side terminal, the drain terminal in the first switching elements being coupled to the first lower-potential side terminal, the drain terminal in the second switching elements being coupled to the second lower-potential side terminal different from the first lower-potential side terminal; and
- an N-type channel field-effect transistor including a gate terminal, a source terminal, and a drain terminal, the drain terminal being coupled to the higher-potential side terminal, the source terminal in the first switching elements being coupled to the first lower-potential side terminal, the source terminal in the second switching elements being coupled to the second lower-potential side terminal different from the first lower-potential side terminal;

the signal supply controller is configured to perform control:
when measuring a resistance value of the N-type channel field-effect transistor of the one of the first and second switching elements, to supply a signal, which allows a level of a resistance value of the N-type channel field-effect transistor of the first and second switching elements to be a predetermined level, to the gate terminal of the N-type channel field-effect transistor of the first switching elements via the first signal wire and the second switching elements via the second signal wire, and to supply a signal, which allows a level of a resistance value of the N-type channel field-effect transistor of the first and second switching elements to be a predetermined level, to the gate terminal of the N-type channel field-effect transistor of the first switching elements via the first signal wire and the second switching elements via the second signal wire; and to set a current flowing through the higher-potential side terminal in the one of the first and second switching elements as the measurement object to a value which causes the level of the resistance value to be a predetermined level; and the measurer is configured:

to measure a voltage with a voltmeter coupled to another of the first and second switching elements, in a state where a level of a resistance value of the N-type channel field-effect transistor of the one of the first and second switching elements is set to the predetermined level; and to measure a resistance value of the N-type channel field-effect transistor of the one of the first and second switching elements, based on the measured voltage and the set value of current.

10. The semiconductor integrated circuit according to claim 9, wherein:

the signal supply controller is configured to perform control:

when measuring a combined resistance value of a resistance value of the P-type channel field-effect transistor of the one of the first and second switching elements and a resistance value of the N-type channel field-effect transistor of the one of the first and second switching elements, to supply a signal, which allows a level of a resistance value of each of the P-type channel field-effect transistor and the N-type channel field-effect transistor of the first and second switching elements to be a predetermined level, to the gate terminal of the P-type channel field-effect transistor and the gate terminal of the N-type channel field-effect transistor of the first and second switching elements via the first signal wire and via the second signal wire; and to set a current flowing through the higher-potential side terminal in the one of the first and second switching elements as the measurement object to a value which causes the level of the resistance value to be a predetermined level; and the measurer is configured:

to measure a voltage with a voltmeter coupled to another of the first and second switching elements, in a state where a level of a resistance value of each of the P-type channel field-effect transistor and the N-type channel field-effect transistor of the one of the first and second switching elements is set to the predetermined level; and to measure the combined resistance value of the one of the first and second switching elements, based on the measured voltage and the set value of current.

* * * * *